(12) United States Patent
Zhang et al.

(10) Patent No.: US 6,454,635 B1
(45) Date of Patent: Sep. 24, 2002

(54) METHOD AND APPARATUS FOR A WAFER CARRIER HAVING AN INSERT

(75) Inventors: Guoqiang David Zhang, Ballwin; Yun-Biao Xin, St. Peters; Henry F. Erk, St. Louis, all of MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 92 days.

(21) Appl. No.: 09/633,958

(22) Filed: Aug. 8, 2000

(51) Int. Cl.⁷ ............................. B24B 1/00; B23P 6/00
(52) U.S. Cl. ..................... 451/41; 29/402.08; 451/269; 451/398
(58) Field of Search .................. 451/41, 63, 57, 451/262, 263, 264, 265, 266, 267, 268, 269, 385, 397, 398; 29/402.03, 402.08, 402.09

(56) References Cited

U.S. PATENT DOCUMENTS

| | | | |
|---|---|---|---|
| 2,466,610 A | * | 4/1949 | Newman ..................... 451/287 |
| 3,673,745 A | * | 7/1972 | Watanabe et al. ........... 451/194 |
| 4,319,432 A | * | 3/1982 | Day ........................... 451/269 |
| 4,739,589 A | | 4/1988 | Brehm et al. |
| 5,422,316 A | | 6/1995 | Desai et al. ................. 437/228 |
| 5,914,053 A | | 6/1999 | Masumura et al. ........... 216/88 |
| 5,993,293 A | | 11/1999 | Cesna et al. ................. 451/41 |
| 6,012,964 A | | 1/2000 | Arai et al. ..................... 451/5 |
| 6,036,587 A | | 3/2000 | Tolles et al. |
| 6,042,688 A | | 3/2000 | Masumura et al. ......... 156/345 |

FOREIGN PATENT DOCUMENTS

| | | |
|---|---|---|
| EP | 0 931 623 A1 | 7/1999 |
| GB | 2 336 121 A | 10/1999 |

OTHER PUBLICATIONS

International Search Report from the European Patent Office dated Feb. 14, 2002.

* cited by examiner

*Primary Examiner*—Timothy V. Eley
(74) *Attorney, Agent, or Firm*—Senninger, Powers, Leavitt & Roedel (57) ABSTRACT

A method for repairing a wafer carrier after plural processing operations during which the carrier holds a plurality of semiconductor wafers in a processing apparatus which removes wafer material by at least one of abrading and chemical reaction. The wafer carrier has holes for receiving respective ones of the wafers and removable annular inserts for each hole. Each insert is receivable in a respective one of the holes for engaging a peripheral edge of one of the wafers. The thickness of the insert is reduced during the successive processing operations. The method includes removing at least one of the inserts from the wafer carrier and installing at least one new insert in the wafer carrier having a thickness substantially greater than a minimum thickness to extend the useful life of the wafer carrier and to improve the flatness and parallelism of surfaces of wafers processed using the wafer carrier.

16 Claims, 5 Drawing Sheets

METHOD AND APPARATUS FOR A WAFER CARRIER HAVING AN INSERT

BACKGROUND OF THE INVENTION

The present invention relates generally to semiconductor wafer processing, and more particularly to wafer carriers for retaining semiconductor wafers during processing operations.

In conventional wafer processes, such as a polishing operation, a wafer carrier C (shown in section in FIG. 7) is used to retain a plurality of wafers W (one is shown) during the operation. The wafer carrier is typically a thin, flat plate, usually made of metal, disposed between the polishing pads P of the polishing machine. The plate has several large circular holes cut therein, each hole being sized larger than a wafer to be received therein. Conventional carriers may include a molded ring R permanently affixed to the plate and extending inwardly from the edge of each hole. The ring acts as a buffer between the wafer and the metal plate in order to protect the edge of the wafer from chipping or other damage. The ring and the plate must be of appropriate thickness, i.e., slightly thinner than the wafer, so that the pads of the polishing machine will contact substantially the entirety of both sides of the wafer. The ring is made of plastic or another material which is softer than the metal plate to protect the wafer edges from engaging the metal plate during operation, which can damage the wafer.

Figure 7:
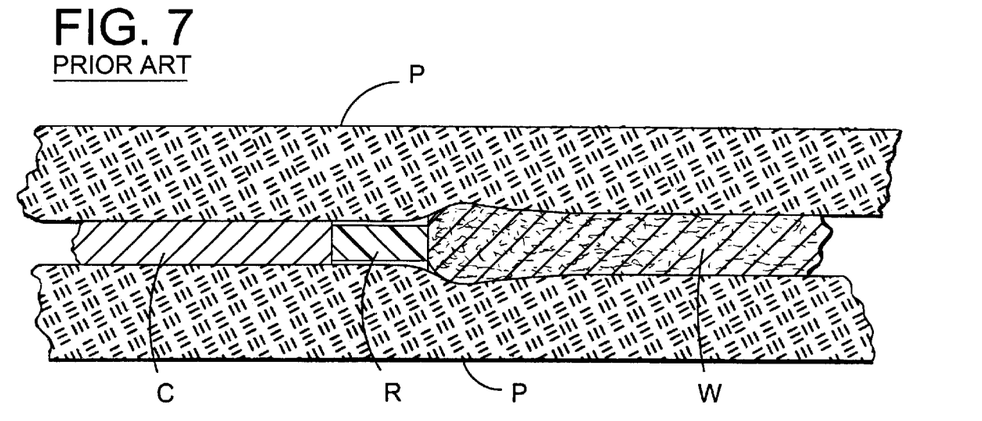
FIG. 7 is a fragmentary, greatly enlarged section through a wafer, a carrier of the prior art and polishing pads of the polishing apparatus during a polishing operation.
Figure 7A:
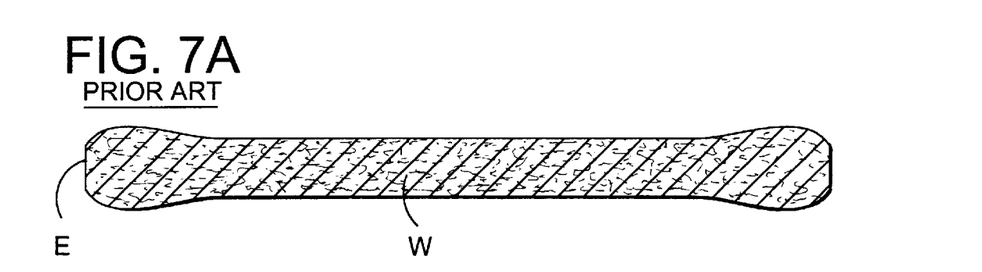
FIG. 7A is a section view of a wafer after polishing using the prior art carrier.
Figure 8:
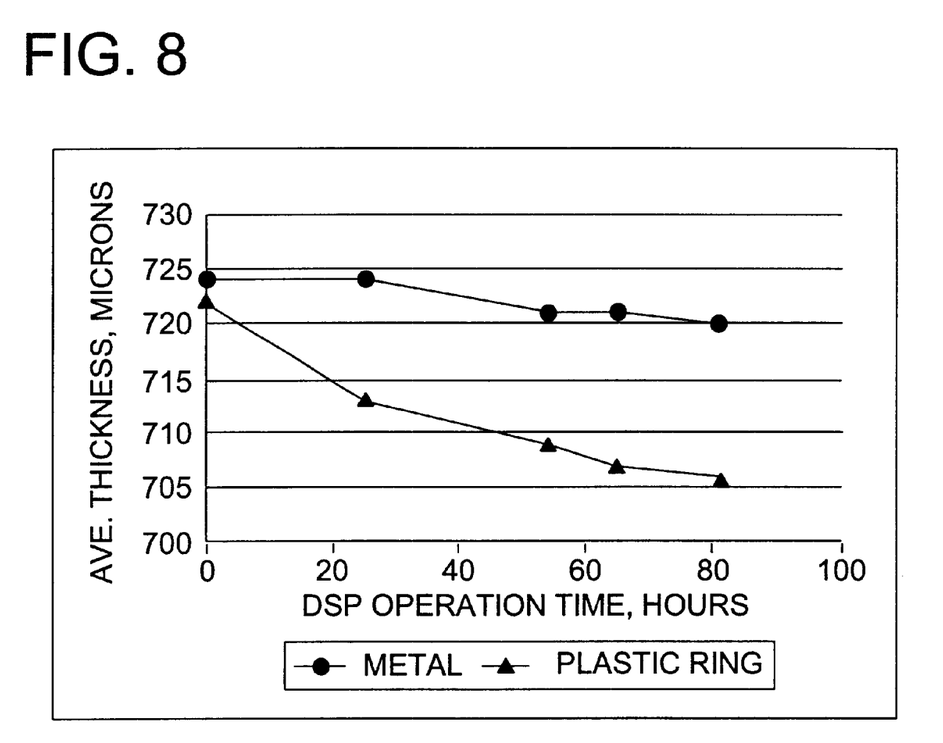
FIG. 8 is a graph showing the average thickness of metal and plastic portions of a prior art carrier after successive polishing operations.

The carrier and insert are both worn down by the polishing operation. As shown graphically in FIG. 8, the plastic ring will wear down (i.e., become thinner) more rapidly than the metal plate during repeated cycles in the lapping or polishing machine. For example, after about 80 hours of polishing operation, the metal thickness is reduced about 4 microns, while the ring thickness is reduced about 16 microns. It is known that thinning of the ring negatively affects the quality of the processed wafer. The thin ring, as shown in FIG. 7, causes the pads to deform outward away from the wafer edge. Such deformation of the pads causes the wafer to be thicker at a peripheral edge margin (sometimes referred to as a "dog-bone" shape), as shown in FIG. 7A. (The thickness of the wafer edge margin and the difference in thickness between the wafer and the ring is exaggerated for illustration purposes.) Conventional carriers having rings which are too thin cannot be repaired, but rather must be replaced entirely. Since carriers are expensive, they tend to be replaced too infrequently, thereby negatively affecting the quality of the wafers produced toward the end of the useful life of the carrier.

It is further known that the softness of the plastic material conventionally used for the ring may negatively affect the shape of the wafer edge E. The soft material causes more friction to be created between the wafer and the ring which causes increased wear of the wafer material at the wafer edge E. Moreover, the friction increases the temperature at the wafer edge which increases the rate of chemical reaction between the polishing slurry and the wafer material at the wafer edge. The rate at which the slurry removes wafer material from the wafer edge is thereby increased. Thus, as shown in FIG. 7A, the edge of the wafer polished using the conventional carrier having the conventional ring typically has a flattened edge due, at least in part, to the increased friction between the wafer and the ring.

SUMMARY OF THE INVENTION

Among the several objects of the present invention may be noted the provision of a method of repairing a wafer carrier that extends the useful life of the wafer carrier; the provision of such a method that improves the flatness of processed semiconductor wafers; the provision of such a method that improves the edge shape of processed semiconductor wafers; and the provision of such a method which is economical and easy to perform.

Further among the several objects of the present invention may be noted the provision of a wafer carrier for retaining a plurality of semiconductor wafers in a processing apparatus which is easily repairable; the provision of such a wafer carrier which has a longer useful life; and the provision of such a wafer carrier which is economical for use in processing wafers.

Briefly, a method of the present invention is directed to repairing a wafer carrier after plural processing operations during which the carrier holds a plurality of semiconductor wafers in a processing apparatus which removes wafer material by at least one of abrading and chemical reaction. The wafer carrier has holes therein for receiving respective ones of the wafers and removable annular inserts for each hole. Each insert is receivable in a respective one of the holes for engaging a peripheral edge of one of the wafers. The thickness of the insert is reduced during the successive processing operations. The method comprises removing at least one of the inserts from the wafer carrier and installing at least one new insert in the wafer carrier having a thickness substantially greater than a minimum thickness to extend the useful life of the wafer carrier and to improve the flatness and parallelism of surfaces of wafers processed using the wafer carrier.

Another aspect of the invention is a wafer carrier for retaining a plurality of semiconductor wafers in a processing apparatus during a processing operation which removes wafer material by at least one of abrading and chemical reaction. The processing apparatus is adapted for removing wafer material from a front surface and a back surface of each wafer simultaneously. The wafer carrier comprises a blank of material having an opening therein. An insert is disposed in the opening for receiving one of the wafers and engages a peripheral edge of the wafer to hold the wafer as the carrier rotates so as to inhibit damage to the edge of the wafer during the processing operation. The insert is removably engageable with the carrier in the opening. The insert is releasably held in the opening such that the insert can be non-destructively removed and replaced with another insert for extending the useful life of the wafer carrier and to improve the flatness and parallelism of the front and back surfaces of the wafers processed using the wafer carrier.

Yet another aspect of the invention is a method of processing a plurality of semiconductor wafers in a processing apparatus which removes wafer material by at least one of abrading and chemical reaction comprising placing a wafer carrier in the apparatus. The wafer carrier having holes therein and inserts are placed in the holes. Each insert is made of a softer material than that of the carrier. Wafers are placed into the inserts, and top and bottom surfaces of each wafer are brought into contact with corresponding ones of an upper platen and a lower platen of the processing apparatus for simultaneously removing wafer material from both front and back surfaces of each wafer.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
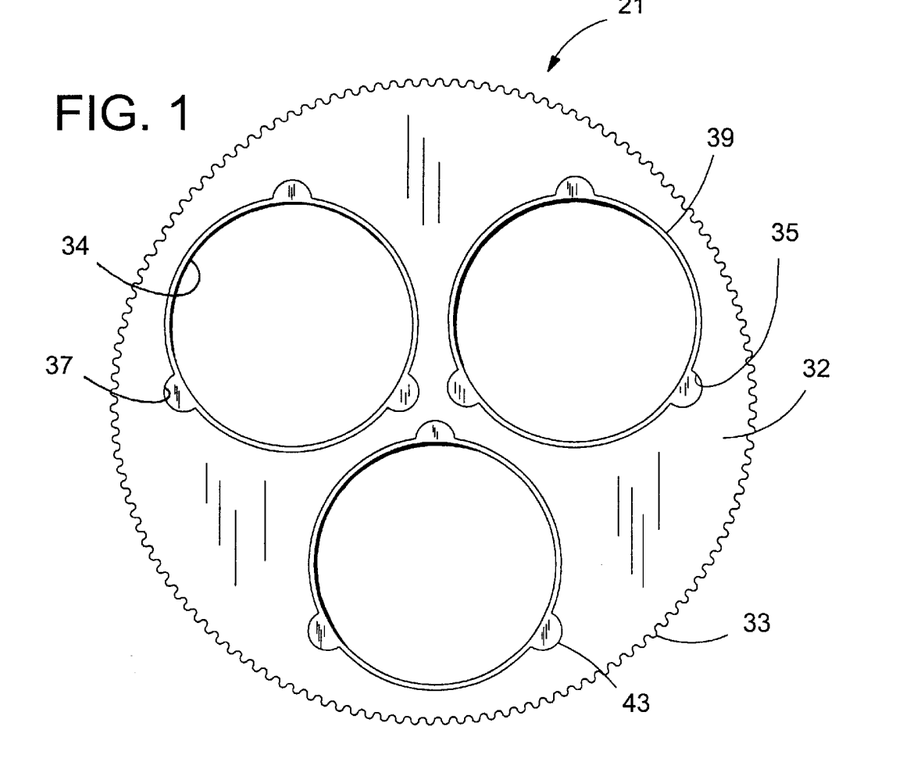
FIG. 1 is a plan view of a wafer carrier of the present invention.
Figure 2:
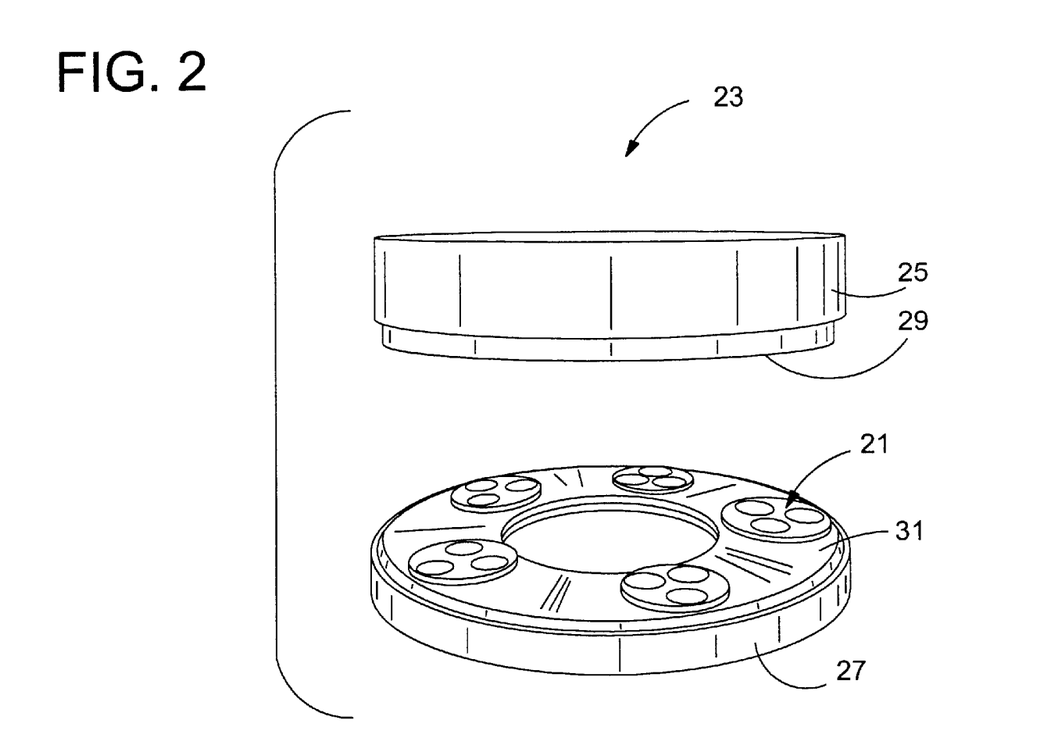
FIG. 2 is a schematic perspective view of a polishing apparatus.

Referring now to the drawings and in particular to FIGS. 1 and 2, a wafer carrier of the present invention is designated in its entirety by the reference numeral 21. Generally, the carrier retains a plurality of semiconductor wafers W in a processing apparatus, referred to generally as 23, during a processing operation which removes wafer material by at least one of abrading and chemical reaction. The processing apparatus 23, a portion of which is shown schematically in FIG. 2, is adapted for removing wafer material from a front surface or side and a back surface or side of each wafer simultaneously. A suitable, commercially available processing apparatus is a Model AC1400 double side processing apparatus made by Peter Wolters GmbH, Rendsburg, Germany, though other types of processing apparatus may be used. The apparatus 23 includes a generally circular upper platen 25 and a generally circular lower platen 27. For polishing wafers, an upper polishing pad 29 is mounted on the downwardly facing surface of the upper platen 25 and a lower polishing pad 31 is mounted on the upwardly facing surface of the lower platen 27. Note that the pads are not used for lapping wafers.

Figure 3:
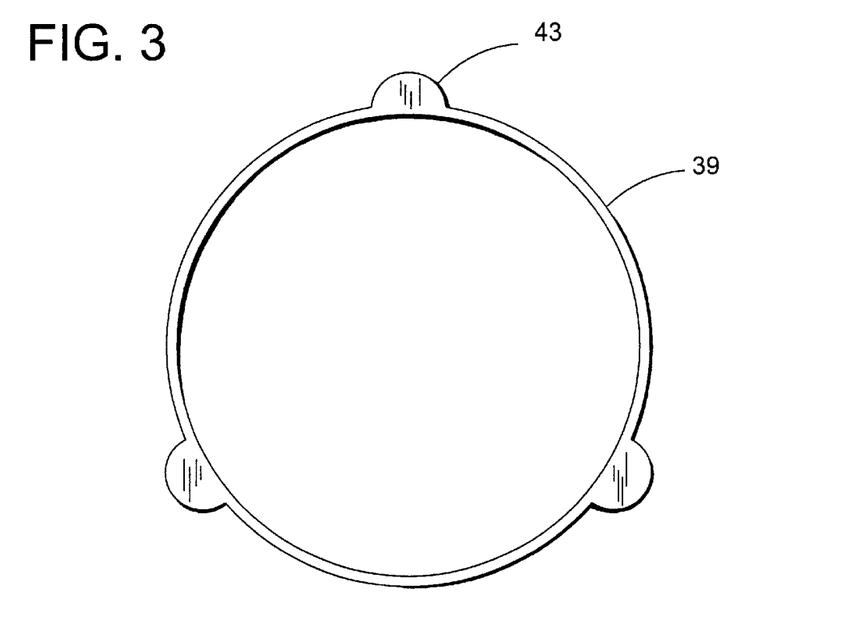
FIG. 3 is a plan view of an insert of the carrier.

Referring to FIGS. 1 and 3, the carrier 21 comprises a circular blank 32 of material having gear teeth 33 on its periphery for engaging driven gear teeth (not shown) of the processing apparatus 23. The blank 32 has openings 34 therein and three arcuate, ear-shaped female elements 35 adjacent each opening. In the preferred embodiments, the female elements 35 constitute "mounting structure" 37. The precise number and shape of the female elements may be other than as described in the preferred embodiments without departing from the scope of the present invention. Moreover, "mounting structure" is intended to encompass structure other than openings 34 in the carrier 21 which facilitates non-permanent mounting of inserts in a carrier. The blank 32 may also include several slurry holes (not shown) as required. A ring-shaped insert 39 is disposed in each opening 34 and has a circular hole 40 for receiving one of the wafers and engaging a peripheral edge of the wafer to hold the wafer as the carrier 21 rotates so as to inhibit damage to the edge of the wafer during rotation. The insert 39 is removably engageable with the mounting structure 37 such that the insert is replaceable by a replacement insert for extending the useful life of the wafer carrier 21 and to improve the flatness and parallelism of the front and back surfaces of said wafers processed using the wafer carrier. The insert 39 includes three ear-shaped male elements 43 to formed integrally therewith for mating with the female elements 35 of the mounting structure 37 in the blank 32. The insert 39 is sized to have an outside diameter slightly smaller than the diameter of the blank 32 such that the insert may be slipped into the opening. It is contemplated that the insert may have a closer fit with the opening, such as a snug fit or an interference fit. Preferably the outside diameter of the insert is about 0.5 to 1.0 mm smaller than the diameter of the opening 34 so that there is a relatively close fit. Preferably, the fit is such that the insert 39 can be inserted and removed by hand, i.e., there is a slip fit between the insert and the opening 34. The radial width of the insert 39, i.e., the difference between the outer and inner radii of the insert, is about 4 to 10 mm. For example, a suitable insert has an inner diameter of 200.5 mm, an outer diameter of 218.4 mm, and the opening has a diameter of 219.4 mm. The blank 32 is made of metal such as carbon steel or stainless steel. The insert 39 is made of softer material than the blank, e.g., a plastic such as PEEK™, Delrin™, or Techron PPS™. Preferably, the insert material is, however, harder than conventional plastics used in conventional carriers. For example, conventional plastic in a conventional carrier is 50% nylon and 50% fiberglass having a Rockwell Hardness of about R100 using the ASTM D785 method. A preferred insert of this invention is made of PEEK and has a Rockwell hardness of about R130 using the same method. Such material will inhibit or prevent the edge of the wafer from becoming flattened. As shown in FIG. 4A, the edge of the wafer is preferably rounded after polishing.

Figure 4:
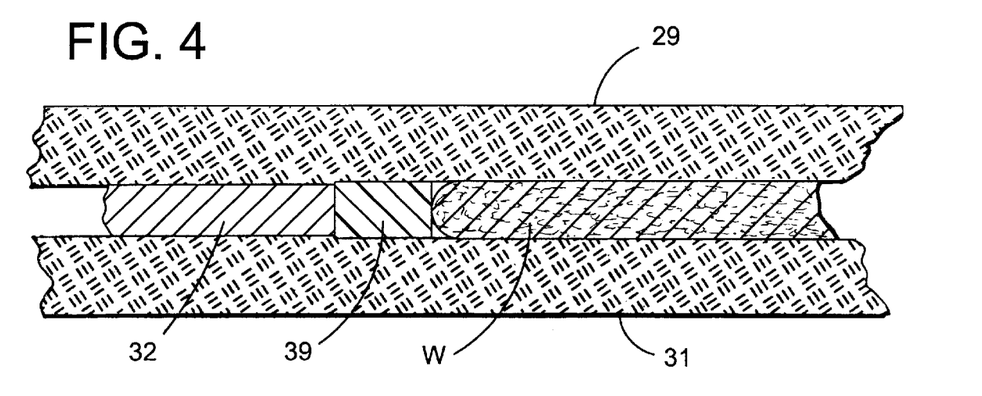
FIG. 4 is a fragmentary, greatly enlarged section through a wafer, the carrier and polishing pads of the polishing apparatus during polishing.
Figure 4A:
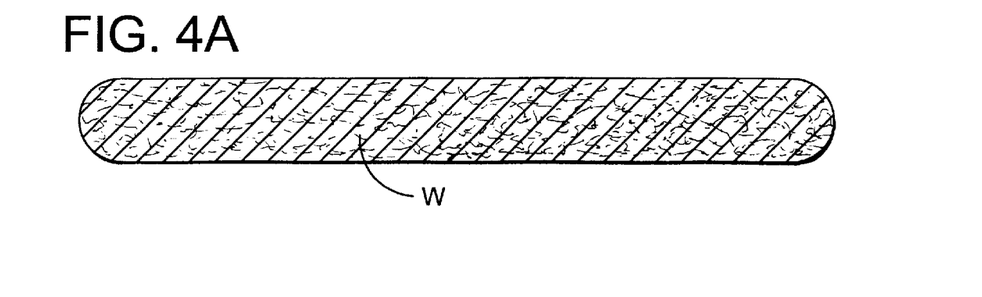
FIG. 4A is a cross section of the wafer after polishing.

Referring to FIG. 4, the preferred thickness of the insert 39 is about 1 to 2 microns thinner than the "target" or end thickness of the polished wafer after simultaneous double side polishing, the wafer being shown at its end thickness. For example, if the target wafer thickness is 725 microns, the insert 39 has a thickness of about 723 microns. The thickness of the insert 39 should vary by no more than about ±2.5 microns. It may be necessary to lap the insert material prior to installation in the carrier 21 in order to achieve the proper thickness. The preferred thickness of the blank is about 10 microns thinner than the insert 39, e.g., about 713 microns. The thickness of the blank 32 should vary by no more than about 5 microns and it may be necessary to lap the blank material prior to installation in the carrier 21 in order to achieve the proper thickness.

The simultaneous double side polishing operation is carried out by placing wafer carriers 21 on the lower polishing pad 31. An insert 39 is placed in each opening 34 of the carrier 21. Wafers are placed into the holes in the inserts 39 in each carrier. A polishing slurry is applied to at least one of the upper and lower pads 29, 31. The upper and lower platens 25, 27 are rotated and the upper platen is moved downward so that the front and back surfaces of each wafer contact either the upper pad 29 or lower pad 31 for simultaneously removing wafer material from both front and back surfaces of each wafer. The wafers are removed from the carrier 21 when the polishing operation is complete. It is contemplated that the same inserts may be installed in the same or a different wafer carrier repeatedly in repeated processing operations. In other words, the inserts may be removed from the carrier between processing operations, and the used insert thereafter re-installed in the same or a different carrier for a successive processing operation. As shown in FIGS. 4 and 4A, the polished wafer has generally rounded edges and is substantially flat, even at the edges.

Multiple polishing operations are performed using the wafer carriers 21 and the thickness of each insert 39 is reduced to a minimum thickness during the successive operations. The wafer carrier 21 is repaired after the multiple operations by removing the insert 39 from the wafer carrier, and installing a new insert in the wafer carrier. The new insert 39 is installed by aligning the male elements 43 of the new insert with the female elements 35 of the carrier 21 and pressing the new insert into the carrier such that the insert is secured in the carrier. Preferably, the insert 39 is retained horizontally in the carrier 21 by the mounting structure, and no adhesive is used to fix the insert in place, i.e., the insert is allowed to move vertically out of the opening. However, it is contemplated that the insert be fixed vertically. The new insert 39 has a thickness as described above. It is not necessary that all inserts of the carrier 21 be replaced at the same time, though doing so is desirable. In general, replacing the inserts extends the useful life of the wafer carrier 21 and improves the flatness and parallelism of the sides of wafers processed using the wafer carrier.

Each insert 39 is suitably replaced after the insert has a thickness less than or equal to the minimum thickness. A suitable minimum thickness is about 10–15 microns thinner than the target thickness of the wafer. The thickness of the is insert 39 may be measured between operations to determine whether the thickness is equal to or less than the minimum thickness. Alternatively, replacement of the insert 39 may be performed after a predetermined number of processing operations. Another alternative is to determine the flatness of the wafers produced using the wafer carrier 21, and determine whether the flatness indicates that replacing the inserts 39 in the carrier may improve the flatness of wafers yet to be processed. For example, the edge roll-off value of a wafer processed in the processing apparatus 23 using the carrier is determined. If the roll-off value exceeds a predetermined limit, the inserts 39 are removed and new inserts installed.

Figure 5:
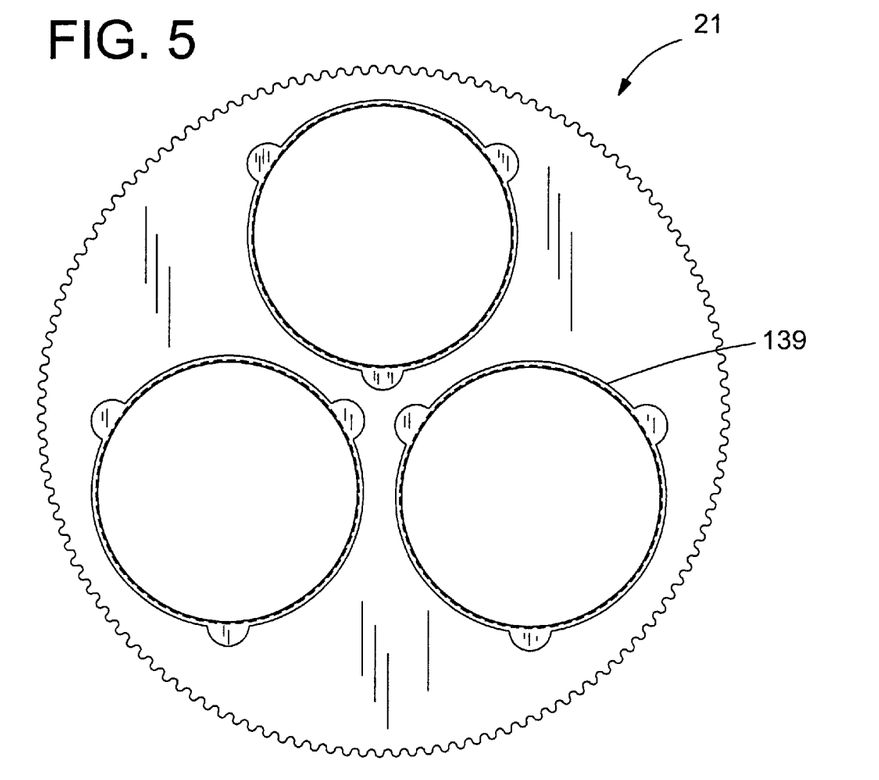
FIG. 5 is a plan view of a wafer carrier of a second embodiment.
Figure 6:
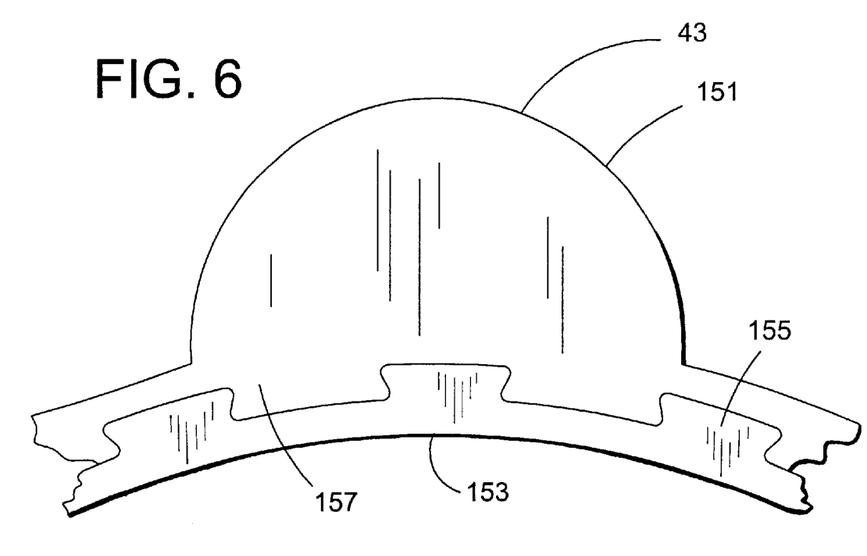
FIG. 6 is a fragmentary plan view of an insert of the second embodiment.

Referring to FIGS. 5 and 6, in a second embodiment, an insert 139 has an outer portion 151 made of metal, which includes the male elements 43 for engaging the blank 32. Preferably, the metal is a carbon or stainless steel. The inner portion 153 of the insert 139 is non-metal, preferably a plastic of the type described above. The outer edge of the inner portion 153 has teeth 155 forming a saw-toothed pattern, the teeth mating with teeth 157 formed on the inner edge of the outer portion 151 to fixedly connect the two portions. The inner portion 153 may be molded into fixed engagement with the outer portion 151, or may be otherwise affixed to the outer portion, such as by an adhesive. The insert 139 is more rigid than the insert 39 of the first embodiment and may therefore be less susceptible to deformation during polishing. Moreover, the insert 139 is heavier than insert 39 so that the insert 139 is less likely to slip out of the opening in the carrier after the carrier has been placed on the lower polishing pad.

Though the invention has been described with respect to a polishing operation, it is to be understood that the carrier 21 and method of this invention may be used in lapping operations.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. A wafer carrier for retaining a plurality of semiconductor wafers in a processing apparatus during a processing operation which removes wafer material by at least one of abrading and chemical reaction, said processing apparatus being adapted for removing wafer material from a front surface and a back surface of each wafer simultaneously, the carrier comprising:

a blank of material having an opening therein and mounting structure associated with the opening; and an insert disposed in the opening for receiving one of said wafers and engaging a peripheral edge of the wafer to hold the wafer as the carrier rotates so as to inhibit damage to the edge of the wafer during the processing operation, the insert being removably engageable with the carrier in the opening and releasably held in the opening such that said insert can be non-destructively removed and replaced with another insert for extending the useful life of the wafer carrier and to improve the flatness and parallelism of the front and back surfaces of said wafers processed using the wafer carrier, the insert having male elements integrally formed therein for engaging the mounting structure in the blank, the mounting structure comprising female elements sized and shaped to mate with the male elements.

2. A wafer carrier as set forth in claim 1 wherein said insert is made of softer material than said blank.

3. A wafer carrier as set forth in claim 1 wherein said insert is made of plastic.

4. A wafer carrier as set forth in claim 1 wherein said insert is made of plastic and metal.

5. A wafer carrier as set forth in claim 1 wherein said male elements are formed of metal and a portion of the insert is made of plastic.

6. A wafer carrier as set forth in claim 1 wherein the blank is generally circular and has gear teeth on its periphery for engaging driven gear teeth of the processing machine.

7. A wafer carrier as set forth in claim 1 in combination with said processing apparatus which comprises a polishing apparatus having upper and lower platens mounting polishing pads for simultaneously removing wafer material from front and back surfaces of said wafers.

8. A method of repairing a wafer carrier after plural processing operations during which the carrier holds a plurality of semiconductor wafers in a processing apparatus which removes wafer material by at least one of abrading and chemical reaction, the wafer carrier having holes therein for receiving respective ones of the wafers and removable annular inserts for each hole, each insert being receivable in a respective one of the holes for engaging a peripheral edge of one of the wafers, the thickness of said insert being reduced during said plural processing operations, the method comprising:

removing at least one of said inserts from the wafer carrier, and installing at least one new insert in the wafer carrier having a thickness substantially greater than a minimum thickness to extend the useful life of the wafer carrier and to improve the flatness and parallelism of surfaces of wafers processed using the wafer carrier, wherein installing the new insert includes aligning male elements of the new insert with corresponding female elements of the carrier and thereafter pressing the new insert into the carrier such that the new insert is secured in the carrier.

9. A method as set forth in claim 8 wherein said removing step is performed after at least some of said inserts have a thickness less than or equal to the minimum thickness.

10. A method as set forth in claim 9 further comprising the step of measuring the thickness of said at least one insert to determine whether the thickness is equal to or less than the minimum thickness.

11. A method as set forth in claim 8 in combination with said successive processing operations, wherein each of said processing operations comprises:

a) placing the carrier in the processing apparatus, b) placing inserts into said holes in the carrier, c) placing wafers into the inserts, d) bringing top and bottom surfaces of each wafer into contact with corresponding ones of an upper platen and a lower platen of the processing apparatus for simultaneously removing wafer material from both front and back surfaces of each wafer, and e) removing the wafers from the carrier.

12. A method as set forth in claim 11 wherein said step of removing said at least one insert is performed after a predetermined number of processing operations.

13. A method as set forth in claim 11 further comprising determining an edge roll-off value of a wafer processed in the processing apparatus and performing said steps of removing said at least one insert and installing a new insert if the edge roll-off value exceeds a predetermined limit.

14. A method as set forth in claim 1 wherein said new insert is sized to be slightly smaller than the hole in the carrier such that the new insert is secured to the carrier without adhesive.

15. A method as set forth in claim 8 wherein the inserts are made of plastic.

16. A method as set forth in claim 8 wherein the inserts are made of plastic and metal.

* * * * *

UNITED STATES PATENT AND TRADEMARK OFFICE
CERTIFICATE OF CORRECTION

PATENT NO. : 6,454,635 B1 Page 1 of 1
DATED : September 24, 2002
INVENTOR(S) : Guoqiang David Zhang, Yun-Biao Xin and Henry F. Erk It is certified that error appears in the above-identified patent and that said Letters Patent is hereby corrected as shown below:

<u>Column 8,</u>
Line 15, "claim 1" should read -- claim 8 --.

Signed and Sealed this

Sixth Day of January, 2004

JAMES E. ROGAN
*Director of the United States Patent and Trademark Office*